United States Patent
Yu et al.

(10) Patent No.: US 9,204,581 B2
(45) Date of Patent: Dec. 1, 2015

(54) METHOD FOR PERFORMING CHIP LEVEL ELECTROMAGNETIC INTERFERENCE REDUCTION, AND ASSOCIATED APPARATUS

(71) Applicant: MEDIATEK INC., Hsin-Chu (TW)

(72) Inventors: Long-Kun Yu, New Taipei (TW); Kuo-Liang Deng, Miaoli County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 213 days.

(21) Appl. No.: 13/676,098

(22) Filed: Nov. 14, 2012

(65) Prior Publication Data

US 2013/0120958 A1    May 16, 2013

Related U.S. Application Data

(60) Provisional application No. 61/559,247, filed on Nov. 14, 2011.

(51) Int. Cl.
*H05K 9/00*    (2006.01)

(52) U.S. Cl.
CPC ................................. *H05K 9/0066* (2013.01)

(58) Field of Classification Search
CPC .................................................. H05K 9/0066
USPC .......... 361/763, 800, 816, 818; 174/350, 353, 174/362
See application file for complete search history.

(56) References Cited

U.S. PATENT DOCUMENTS

| 2003/0169838 A1* | 9/2003 | Greenstreet et al. .......... 375/376 |
| 2009/0169874 A1* | 7/2009 | McCloskey et al. .......... 428/336 |
| 2009/0207538 A1* | 8/2009 | Crawley et al. .................. 361/56 |
| 2009/0322441 A1* | 12/2009 | Chen et al. ....................... 333/12 |
| 2010/0127739 A1* | 5/2010 | Ebuchi et al. ................. 327/148 |
| 2011/0234318 A1* | 9/2011 | Abugharbieh et al. ....... 330/253 |

FOREIGN PATENT DOCUMENTS

| CN | 1402605 A | * | 3/2003 |
| CN | 1760783 A | | 4/2006 |
| CN | 1845666 A | | 10/2006 |
| CN | 102064808 A | | 5/2011 |
| JP | 201045940 | | 2/2010 |

OTHER PUBLICATIONS

"International Search Report" mailed on Feb. 28, 2013 for International application No. PCT/CN2012/084589, International filing date:Nov. 14, 2012.

* cited by examiner

*Primary Examiner* — Jenny L Wagner
*Assistant Examiner* — Michael P McFadden
(74) *Attorney, Agent, or Firm* — Winston Hsu; Scott Margo

(57) ABSTRACT

A method for performing chip level electromagnetic interference (EMI) reduction is provided, where the method is applied to an electronic device. The method includes: providing at least one EMI suppression circuit within at least one chip of the electronic device; and utilizing the at least one EMI suppression circuit within the at least one chip to perform EMI reduction on at least one signal within the at least one chip. In particular, the at least one chip includes a first chip and a second chip; and the at least one EMI suppression circuit includes a first EMI suppression circuit positioned within the first chip, and further includes a second EMI suppression circuit positioned within the second chip. An associated apparatus is also provided.

20 Claims, 15 Drawing Sheets

METHOD FOR PERFORMING CHIP LEVEL ELECTROMAGNETIC INTERFERENCE REDUCTION, AND ASSOCIATED APPARATUS

CROSS REFERENCE TO RELATED APPLICATIONS

This application claims the benefit of U.S. Provisional Application No. 61/559,247, which was filed on Nov. 14, 2011 and is entitled "Chip Level EMI Reduction Method and Apparatus", and is included herein by reference.

BACKGROUND

The present invention relates to electromagnetic interference (EMI) reduction of an electronic device, and more particularly, to a method for performing chip level EMI reduction, and to an associated apparatus.

According to the related art, although there are plenty of proposed EMI solutions, the conventional electronic devices still suffer from some problems. For example, a certain EMI solution of the related art focuses on altering signal paths on printed circuit boards (PCBs), which may cause unacceptable delay of launching the products onto the market. In another example, some other EMI solutions of the related art may focus on adding or re-arranging some components on PCBs, which may cause uncertainty and additional material and labor costs. In another example, another EMI solution of the related art may focus on adding shielding materials to cover some signal paths on PCBs, which may cause additional material and labor costs. In conclusion, the related art does not serve the end user well. Thus, a novel method is required for enhancing EMI reduction of an electronic device.

SUMMARY

It is therefore an objective of the claimed invention to provide a method for performing chip level electromagnetic interference (EMI) reduction, and to provide an associated apparatus, in order to solve the above-mentioned problems.

An exemplary embodiment of a method for performing chip level EMI reduction is provided, where the method is applied to an electronic device. The method comprises: providing at least one EMI suppression circuit within at least one chip of the electronic device; and utilizing the at least one EMI suppression circuit within the at least one chip to perform EMI reduction on at least one signal within the at least one chip. For example, the at least one chip comprises a first chip and a second chip, and the at least one EMI suppression circuit comprises a first EMI suppression circuit positioned within the first chip, and further comprises a second EMI suppression circuit positioned within the second chip. In another example, the at least one chip comprises a first chip, and the at least one EMI suppression circuit comprises a first EMI suppression circuit positioned within the first chip, and further comprises a second EMI suppression circuit positioned within the first chip.

An exemplary embodiment of an apparatus for performing chip level EMI reduction is provided, where the apparatus comprises at least one portion of an electronic device. The apparatus comprises at least one chip of the electronic device, and further comprises at least one EMI suppression circuit integrated into the at least one chip of the electronic device, wherein the at least one EMI suppression circuit within the at least one chip is arranged to perform EMI reduction on at least one signal within the at least one chip. For example, the at least one chip comprises a first chip and a second chip, and the at least one EMI suppression circuit comprises a first EMI suppression circuit positioned within the first chip, and further comprises a second EMI suppression circuit positioned within the second chip. In another example, the at least one chip comprises a first chip, and the at least one EMI suppression circuit comprises a first EMI suppression circuit positioned within the first chip, and further comprises a second EMI suppression circuit positioned within the first chip.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
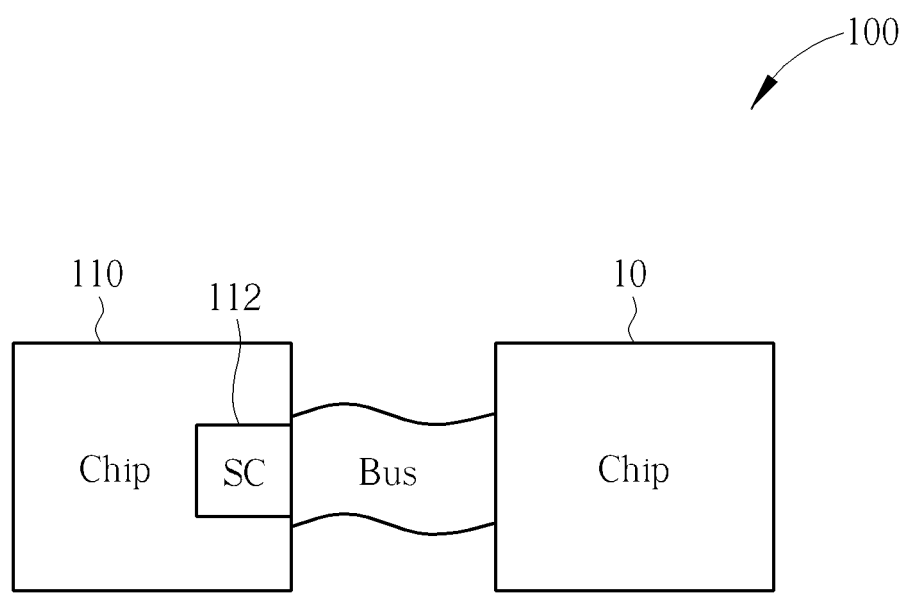
FIG. 1 is a diagram of an apparatus for performing chip level electromagnetic interference (EMI) reduction according to a first embodiment of the present invention.

Please refer to FIG. 1, which illustrates a diagram of an apparatus 100 for performing chip level electromagnetic interference (EMI) reduction according to a first embodiment of the present invention. According to different embodiments, such as the first embodiment and some variations thereof, the apparatus 100 may comprise at least one portion (e.g. a portion or all) of an electronic device. For example, the apparatus 100 may comprise a portion of the electronic device mentioned above, and more particularly, can be a control circuit such as a chipset comprising one or more integrated circuits (ICs) within the electronic device. In another example, the apparatus 100 can be the whole of the electronic device mentioned above. In another example, the apparatus 100 can be an audio/video system comprising the electronic device mentioned above. Examples of the electronic device may include, but not limited to, a mobile phone (e.g. a multifunctional mobile phone), a personal digital assistant (PDA), a portable electronic device such as the so-called tablet, and a personal computer such as a laptop computer or desktop computer.

According to this embodiment, the apparatus 100 may comprise at least one chip of the electronic device, and may further comprise at least one EMI suppression circuit integrated into the at least one chip of the electronic device. As shown in FIG. 1, in addition to the chip 10, the aforementioned at least one chip of the electronic device comprises the chip 110, and the aforementioned at least one EMI suppression circuit integrated into the aforementioned at least one chip comprises the EMI suppression circuit 112 (labeled "SC" in FIG. 1, for brevity, where "SC" stands for "suppression circuit"). In addition, the aforementioned at least one EMI suppression circuit (e.g. the EMI suppression circuit 112) is arranged to perform EMI reduction on at least one signal within the aforementioned at least one chip (e.g. at least one signal within the chip 110). Additionally, the bus shown in FIG. 1 is arranged to electrically connect the chip 10 and the chip 110, where the aforementioned at least one EMI suppression circuit (e.g. the EMI suppression circuit 112) is positioned within the aforementioned at least one chip such as the chip 110, rather than being positioned on the bus shown in FIG. 1. This is for illustrative purposes only, and is not meant to be a limitation of the present invention. According to some variations of this embodiment, the aforementioned at least one EMI suppression circuit may comprise multiple EMI suppression circuits, and/or the aforementioned at least one chip may comprise multiple chips. For example, the at least one chip may comprise a first chip (e.g. the chip 110) and a second chip (which differs from the chip 10), and the aforementioned at least one EMI suppression circuit may comprise a first EMI suppression circuit (e.g. the EMI suppression circuit 112) positioned within the first chip (e.g. the chip 110), and further comprises a second EMI suppression circuit (e.g. a copy of the EMI suppression circuit 112, or a variant thereof) positioned within the second chip. In another example, the aforementioned at least one chip may comprise a first chip (e.g. the chip 110), and the aforementioned at least one EMI suppression circuit may comprise a first EMI suppression circuit (e.g. the EMI suppression circuit 112) positioned within the first chip (e.g. the chip 110), and may further comprise a second EMI suppression circuit (e.g. a copy of the EMI suppression circuit 112, or a variant thereof) positioned within the first chip (e.g. the chip 110).

Figure 2:
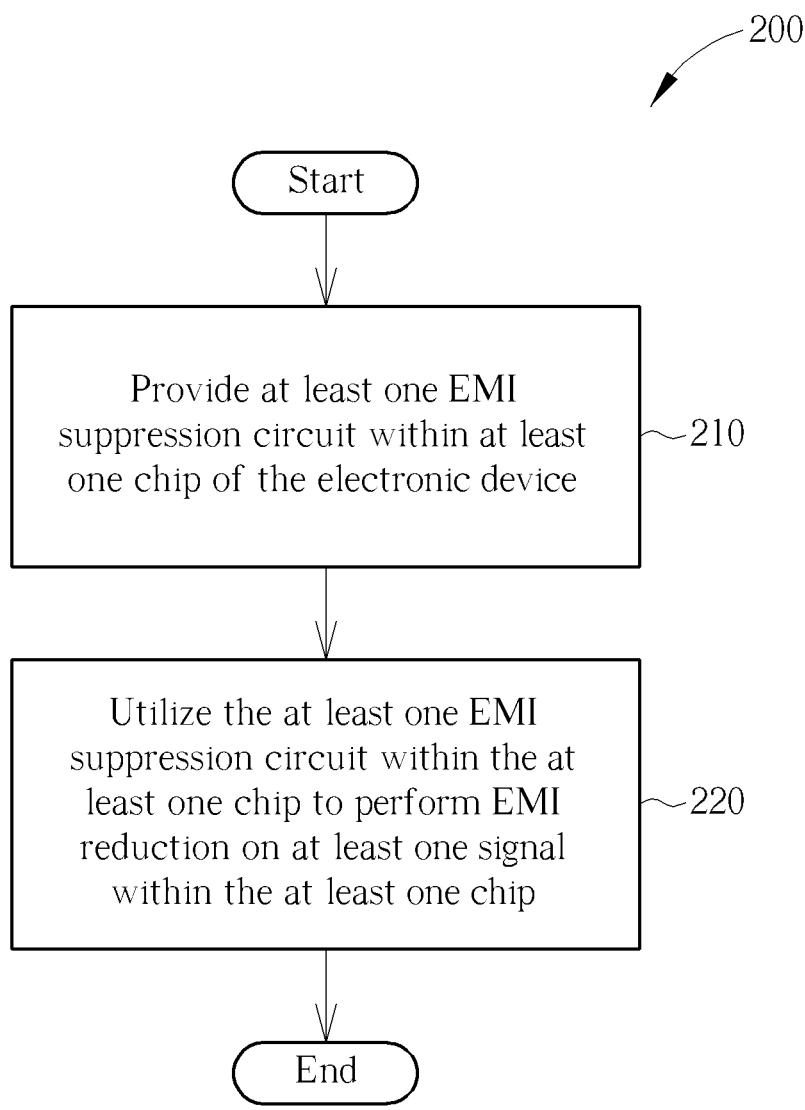
FIG. 2 illustrates a flowchart of a method for performing chip level EMI reduction according to an embodiment of the present invention.

FIG. 2 illustrates a flowchart of a method 200 for performing chip level EMI reduction according to an embodiment of the present invention. The method shown in FIG. 2 can be applied to the apparatus 100 shown in FIG. 1, and can be applied to the apparatus 100 of any of the above-disclosed variations of the first embodiments. The method is described as follows.

In Step 210, the apparatus 100 provides at least one EMI suppression circuit within at least one chip of the electronic device. For example, the aforementioned at least one EMI suppression circuit in the first embodiment can be taken as an example of the at least one EMI suppression circuit mentioned in Step 210, and the aforementioned at least one chip in the first embodiment can be taken as an example of the at least one chip mentioned in Step 210. In some other examples, the aforementioned at least one EMI suppression circuit may comprise multiple EMI suppression circuits, and/or the aforementioned at least one chip may comprise multiple chips.

In Step 220, the apparatus 100 utilizes the at least one EMI suppression circuit within the at least one chip to perform EMI reduction on at least one signal within the at least one chip, whereby radiation of at least one signal path outside the at least one chip is reduced. For example, in a situation where the aforementioned at least one EMI suppression circuit in the first embodiment is taken as an example of the at least one EMI suppression circuit mentioned in Step 210 and the aforementioned at least one chip in the first embodiment is taken as an example of the at least one chip mentioned in Step 210, the aforementioned at least one signal in the first embodiment can be taken as an example of the at least one signal mentioned in Step 210. In some other examples, in a situation where the aforementioned at least one EMI suppression circuit comprises multiple EMI suppression circuits and/or the aforementioned at least one chip comprises multiple chips, the aforementioned at least one signal may comprise multiple signals within the aforementioned at least one chip.

According to this embodiment, the aforementioned at least one chip may comprise the first chip such as the chip 110, and the aforementioned at least one EMI suppression circuit may comprise the first EMI suppression circuit positioned within the first chip, such as the EMI suppression circuit 112. In a situation where the aforementioned at least one signal comprises a first signal within the first chip (e.g. the chip 110), the apparatus 100 typically utilizes the EMI suppression circuit (e.g. the EMI suppression circuit 112) positioned within the first chip (e.g. the chip 110) to perform EMI reduction on the first signal within the first chip. This is for illustrative purposes only, and is not meant to be a limitation of the present invention. As mentioned, the aforementioned at least one EMI suppression circuit may comprise multiple EMI suppression circuits, and/or the aforementioned at least one chip may comprise multiple chips. For example, in a situation where the aforementioned at least one chip further comprises the aforementioned second chip (which differs from the chip 10) and the aforementioned at least one EMI suppression circuit further comprises the aforementioned second EMI suppression circuit (e.g. a copy of the EMI suppression circuit 112, or a variant thereof) positioned within the second chip, the aforementioned at least one signal comprises the first signal within the first chip and further comprises a second signal within the second chip, and the apparatus 100 utilizes the first EMI suppression circuit positioned within the first chip to perform EMI reduction on the first signal within the first chip and further utilizes the second EMI suppression circuit positioned within the second chip to perform EMI reduction on the second signal within the second chip. In another example, in a situation where the aforementioned at least one EMI suppression circuit further comprises the aforementioned second EMI suppression circuit (e.g. a copy of the EMI suppression circuit 112, or a variant thereof) positioned within the first chip (e.g. the chip 110), the aforementioned at least one signal comprises the first signal within the first chip and further comprises a second signal within the first chip, and the apparatus 100 utilizes the first EMI suppression circuit positioned within the first chip to perform EMI reduction on the first signal within the first chip and further utilizes the second EMI suppression circuit positioned within the first chip to perform EMI reduction on the second signal within the first chip.

According to a variation of the embodiment shown in FIG. 2, the first EMI suppression circuit is electrically connected to an internal signal path of the first chip, where the internal signal path is coupled to an input/output (I/O) pad of the first chip. According to another variation of the embodiment shown in FIG. 2, at least one non-ground terminal of the first EMI suppression circuit is electrically connected to an internal signal path of the first chip, and at least one ground terminal of the first EMI suppression circuit is electrically connected to ground or virtual-ground of the first chip.

Figure 3:
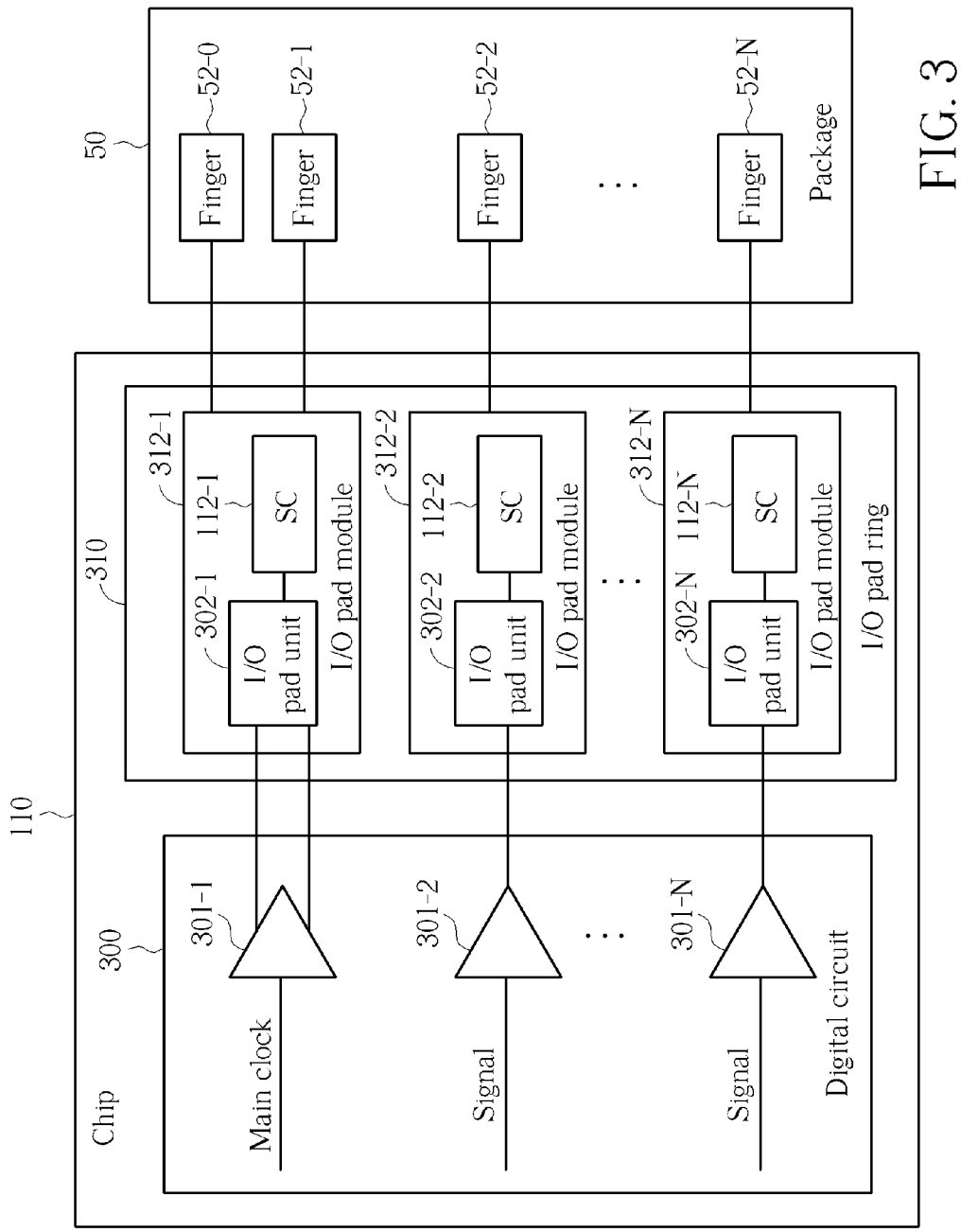
FIG. 3 illustrates some implementation details of the apparatus shown in FIG. 1 according to an embodiment of the present invention.

FIG. 3 illustrates some implementation details of the apparatus 100 shown in FIG. 1 according to an embodiment of the present invention. The chip 110 comprises a digital circuit 300 comprising output buffers 301-1, 301-2, ..., and 301-N respectively receiving a main clock and some signals, and further comprises an I/O pad ring 310 comprising I/O pad modules 312-1, 312-2, ..., and 312-N, where an I/O pad module 312-$n$ within the I/O pad modules 312-1, 312-2, ..., and 312-N (with the notation n representing an integer falling within the range of the interval [1, N] comprises an I/O pad unit 302-$n$ and an EMI suppression circuit 112-$n$ (labeled "SC" in FIG. 3), and the EMI suppression circuit 112-1, 112-2, ..., and 112-N can be taken as examples of the aforementioned at least one EMI suppression circuit. The curves illustrated between the I/O pad modules 312-1, 312-2, ..., and 312-N of the chip 110 and the fingers 52-0, 52-1, 52-2, ..., and 52-N positioned within the package 50 of the chip 110 represent bond wires. As the EMI suppression circuit 112-1, 112-2, ..., and 112-N are within the chip 110, most harmonic components of the digital signals of the digital circuit 300 (e.g. most harmonic components of the main clock and the signals shown in FIG. 3) can be suppressed successfully. As a result of performing chip level EMI reduction by utilizing the aforementioned at least one EMI suppression circuit such as the EMI suppression circuit 112-1, 112-2, ..., and 112-N are within the chip 110, it is unnecessary to implement with the aforementioned EMI solutions of the related art, and therefore, the related art problems can be prevented.

Figure 4:
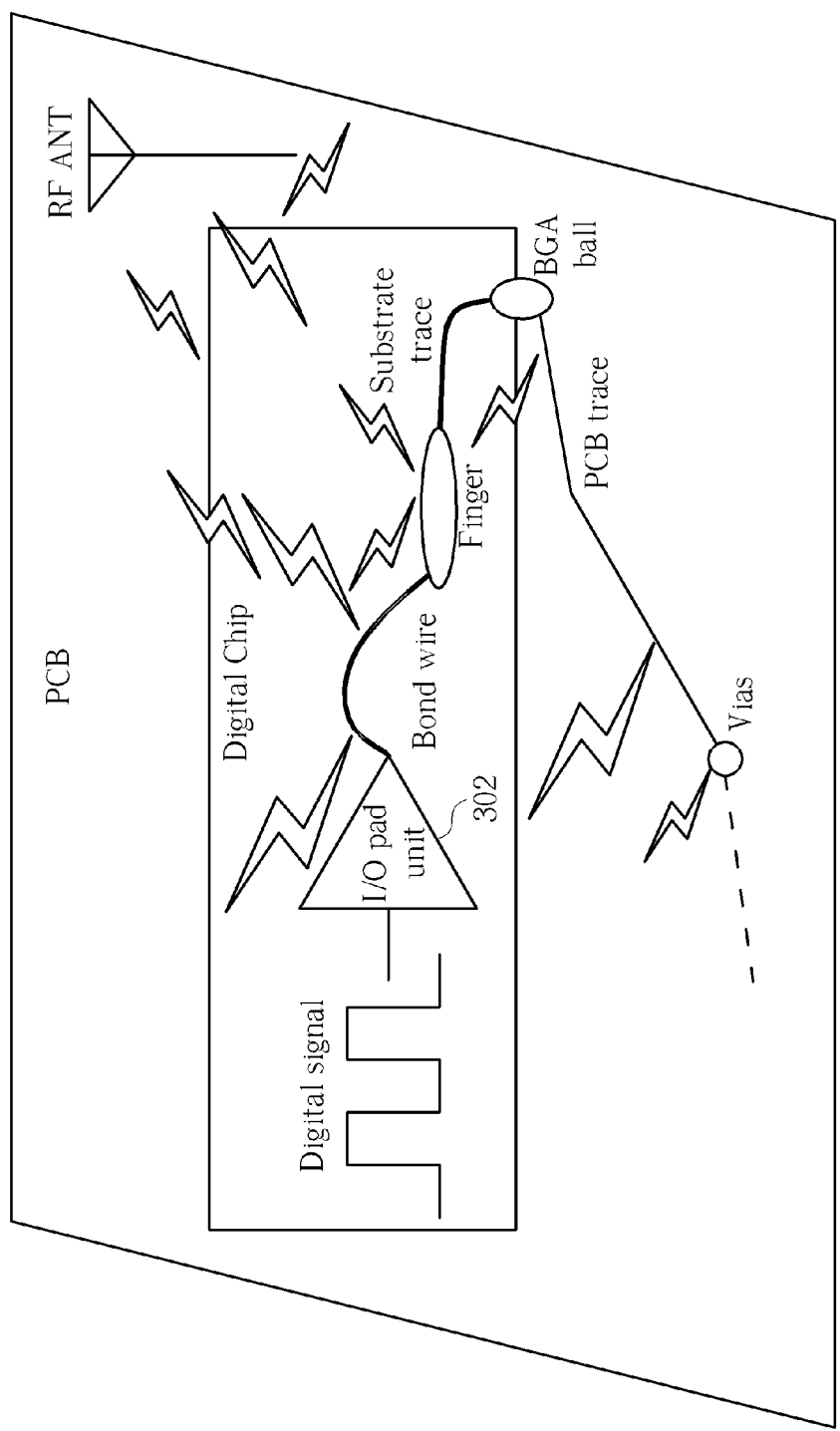
FIG. 4 illustrates some radiation problems that may occur in a situation where the EMI suppression circuits shown in FIG. 3 are temporarily disabled according to an embodiment of the present invention.

FIG. 4 illustrates some radiation problems that may occur in a situation where the EMI suppression circuits 112-1, 112-2, ..., and 112-N shown in FIG. 3 are temporarily disabled (as if they are not implemented within the chip 110) according to an embodiment of the present invention. For example, the EMI suppression circuits 112-1, 112-2, ..., and 112-N of this embodiment may be temporarily disabled by utilizing some switching units that can electrically disconnect the EMI suppression circuits 112-1, 112-2, ..., and 112-N from other portions within the chip 110. The digital chip shown in FIG. 4 may represent the combination of the chip 110 and the package 50 shown in FIG. 3 except that the EMI suppression circuits 112-1, 112-2, ..., and 112-N shown in FIG. 3 are temporarily disabled. In addition, the printed circuit board (PCB) shown in FIG. 4 may represent the PCB where the digital chip shown in FIG. 4 is mounted, where the notation "RF ANT" stands for antenna of the radio frequency (RF) module. Additionally, the I/O pad unit 302 of this embodiment may represent any of the I/O pad units 302-1, 302-2, ..., and 302-N shown in FIG. 3, such as the I/O pad unit 302-$n$ mentioned above. Please note that the bond wire, the package trace, the PCB trace and the associated via(s) all have antenna radiation effect due to the high frequency components corresponding to the sharp edges of the digital signals.

Figure 5:
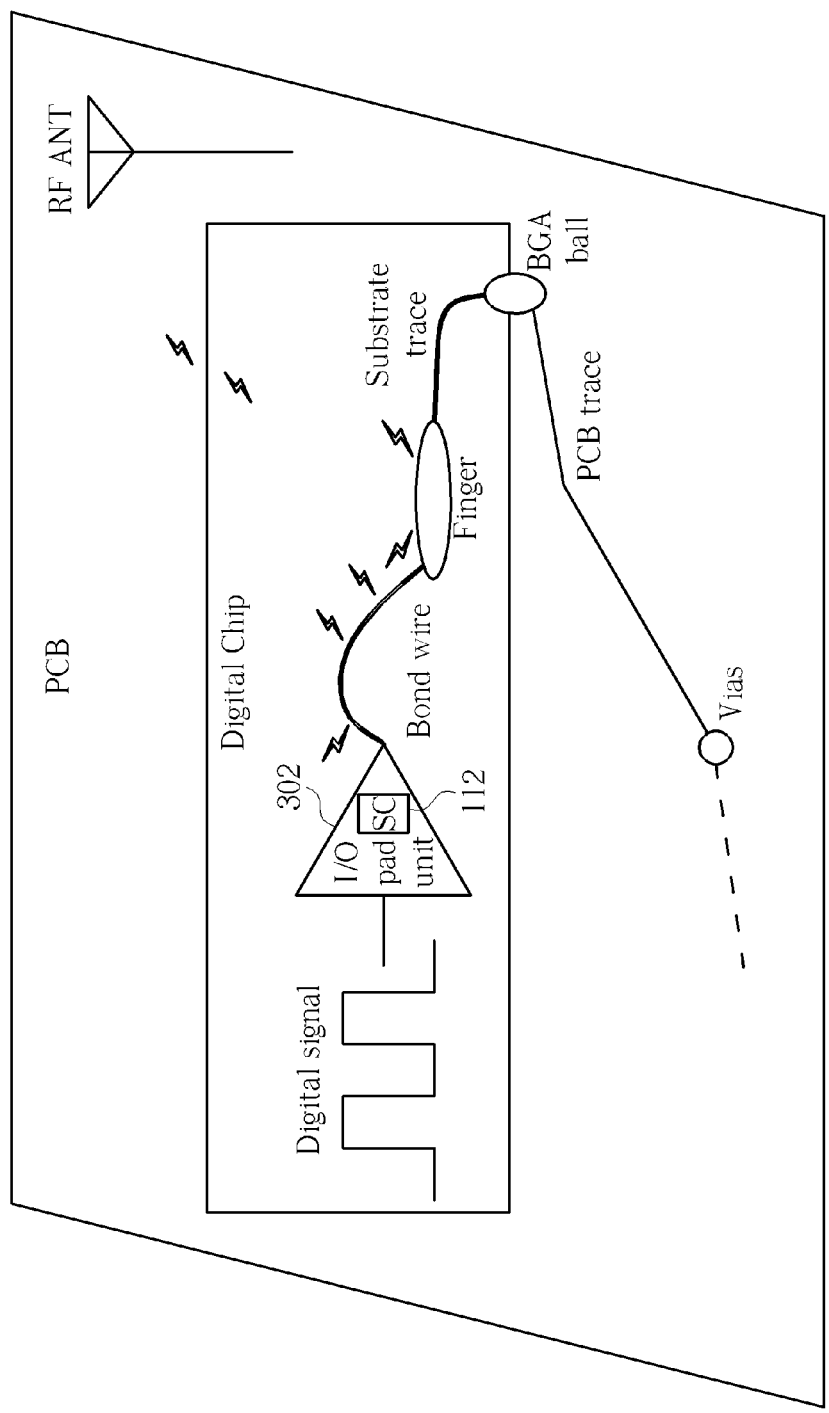
FIG. 5 illustrates that the radiation problems that may occur in the above-mentioned situation of the embodiment shown in FIG. 4 can be reduced or eliminated since the EMI suppression circuits shown in FIG. 3 are implemented within the chip 110, without being disabled, according to another embodiment of the present invention.

FIG. 5 illustrates that the radiation problems that may occur in the above-mentioned situation of the embodiment shown in FIG. 4 can be reduced or eliminated since the EMI suppression circuits 112-1, 112-2, ..., and 112-N shown in FIG. 3 are implemented within the chip 110, without being disabled, according to another embodiment of the present invention. The digital chip shown in FIG. 5 may represent the combination of the chip 110 and the package 50 shown in FIG. 3. In addition, the PCB shown in FIG. 5 may represent the PCB where the digital chip shown in FIG. 5 is mounted. Additionally, the I/O pad unit 302 of this embodiment may represent any of the I/O pad units 302-1, 302-2, ..., and 302-N shown in FIG. 3, such as the I/O pad unit 302-$n$ mentioned above. Please note that the high frequency components corresponding to the sharp edges of the digital signals (more particularly, the clock harmonics) are suppressed in the I/O pad module 312-$n$, which comprises the I/O pad unit 302-$n$ and the EMI suppression circuits 112-$n$, where the I/O pad unit 302 and the EMI suppression circuits 112 shown in FIG. 5 can be regarded as the I/O pad unit 302-$n$ and the EMI suppression circuits 112-$n$ mentioned above, respectively. As a result, the antenna radiation effect mentioned above can be reduced.

Figure 6:
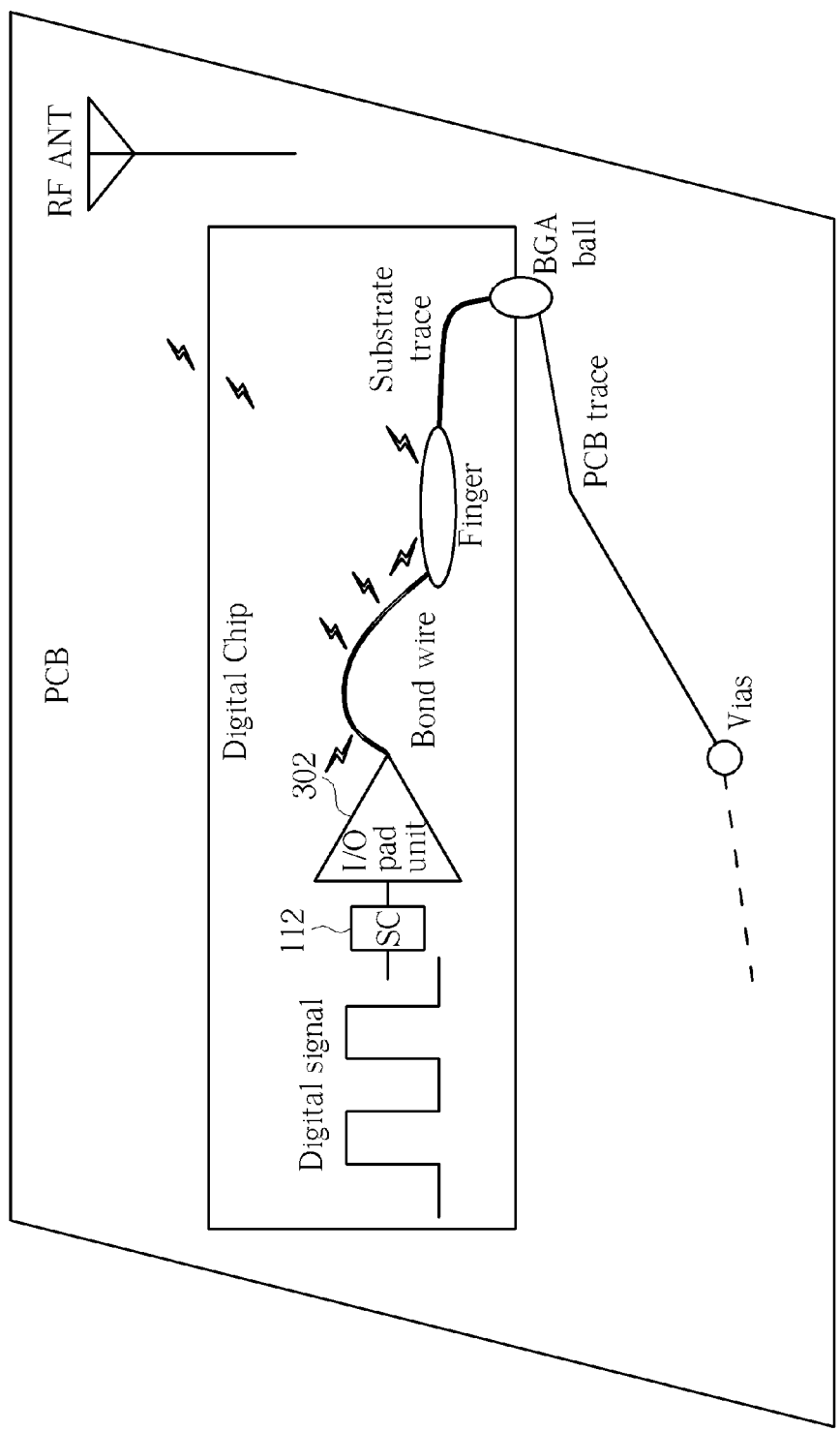
FIG. 6 illustrates another configuration of implementing the EMI suppression circuits shown in FIG. 3 within the chip 110 according to another embodiment of the present invention.

FIG. 6 illustrates another configuration of implementing the EMI suppression circuits 112-1, 112-2, ..., and 112-N shown in FIG. 3 within the chip 110 according to another embodiment of the present invention. In comparison with the configuration of implementing the EMI suppression circuits 112-1, 112-2, ..., and 112-N that is disclosed in the embodiment shown in FIG. 5, the EMI suppression circuits 112 of this embodiment is implemented as the previous stage of the I/O pad unit 302, where the I/O pad unit 302 is positioned between the EMI suppression circuits 112 and the terminal for bounding the bound wire.

Figure 7:
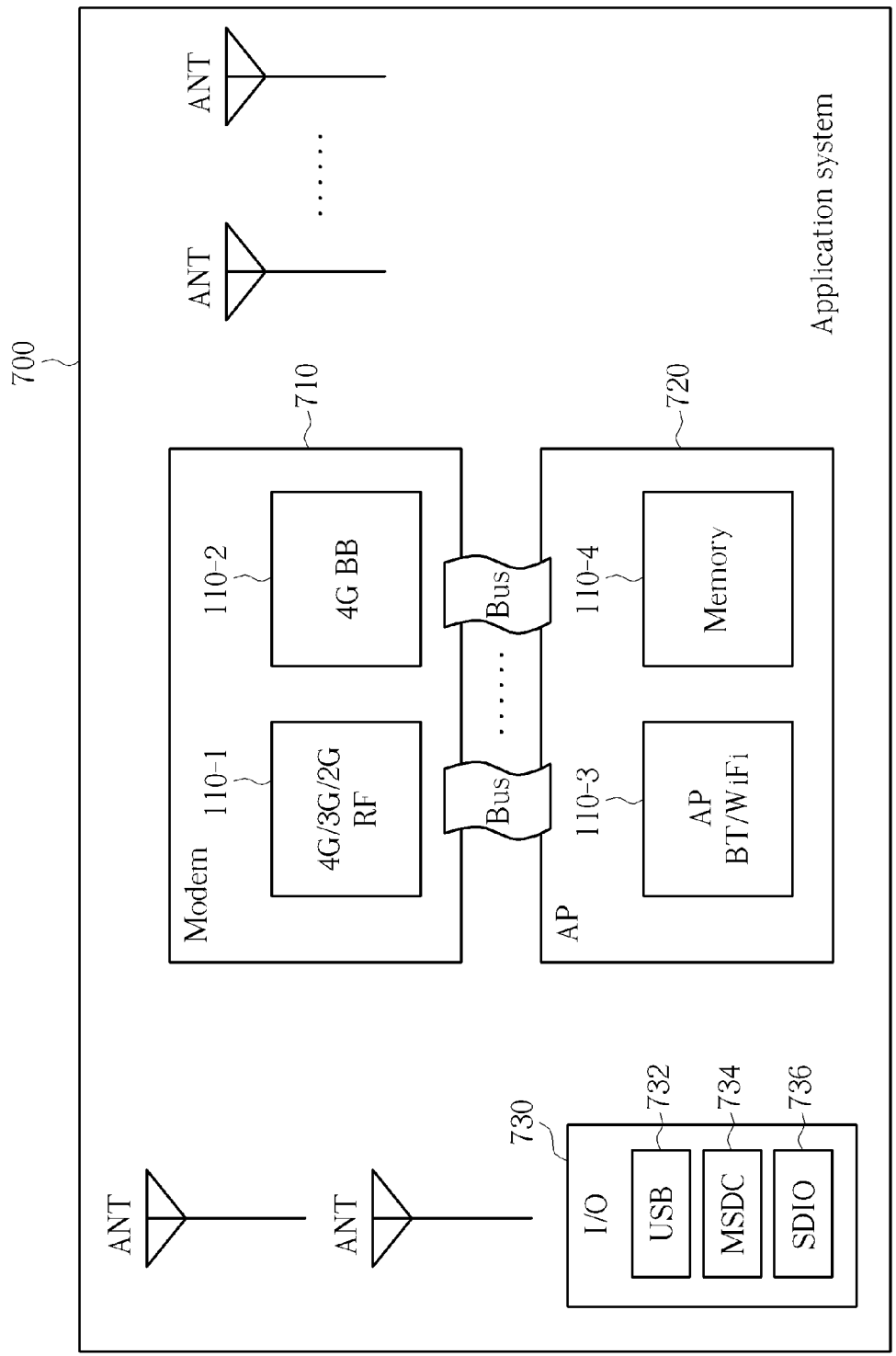
FIG. 7 is a diagram of an apparatus for performing chip level EMI reduction according to an embodiment of the present invention.

FIG. 7 is a diagram of an apparatus 700 for performing chip level EMI reduction according to an embodiment of the present invention, where the apparatus 700 can be implemented as an application system. The aforementioned at least one chip comprises multiple chips such as the chips 110-1, 110-2, 110-3, and 110-4, examples of which can be a $4^{th}$ Generation/$3^{rd}$ Generation/$2^{nd}$ Generation RF circuit (labeled "4G/3G/2G RF", for brevity), a $4^{th}$ Generation baseband circuit (labeled "4G BB", for brevity), an application Bluetooth/Wireless-Fidelity circuit (labeled "AP BT/WiFi", for brevity), and a memory (e.g. a dynamic random access memory (DRAM) or a Flash memory), respectively, where the chips 110-1 and 110-2 are positioned within the package labeled "Modem", and the chips 110-3 and 110-4 are positioned within the package labeled "AP". In addition, the notation ANT stands for antenna. As shown in FIG. 7, the apparatus 700 may further comprise an I/O module 730 (labeled "I/O", for brevity) comprising a Universal Serial Bus (USB) interface circuit 732, a Mass Storage Device Class (MSDC) circuit 734, and a Security Digital I/O (SDIO) circuit 736.

Figure 8:
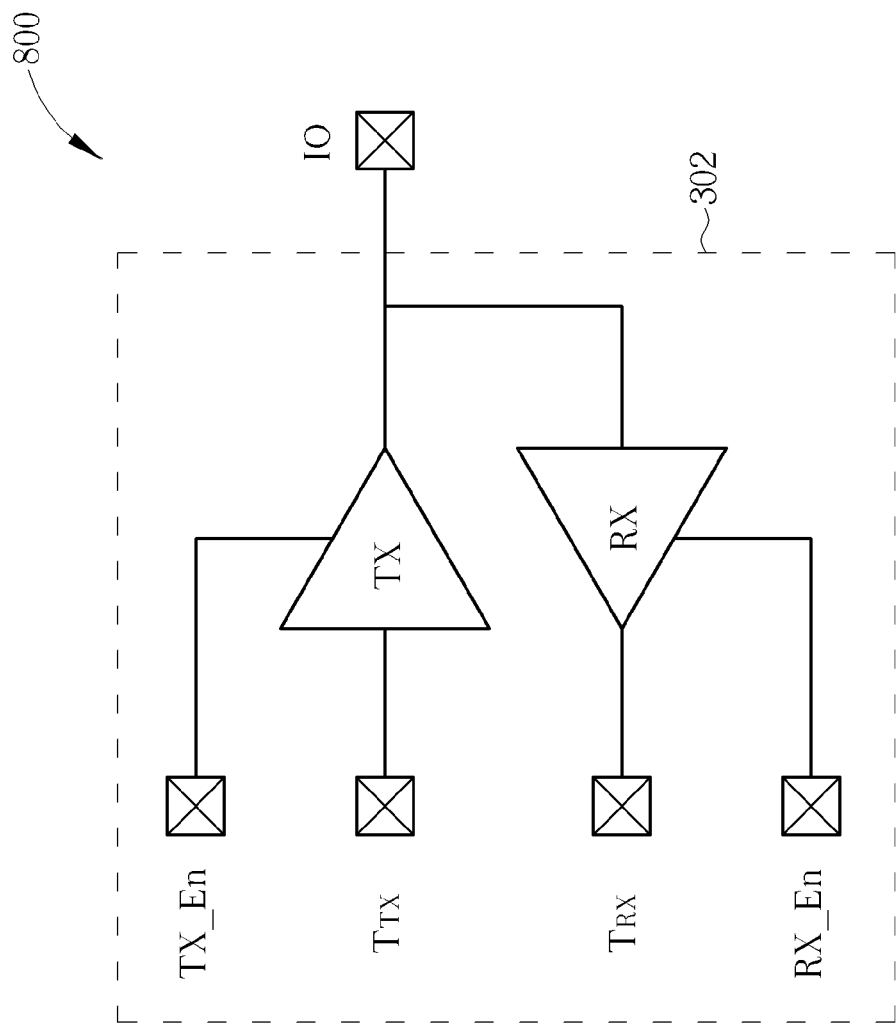
FIG. 8 illustrates some implementation details of the input/output (I/O) pad unit shown in FIG. 5 according to an embodiment of the present invention.

FIG. 8 illustrates some implementation details of the I/O pad unit 302 shown in FIG. 5 according to an embodiment of the present invention. Based upon the architecture 800 shown in FIG. 8, the I/O pad unit 302 comprises a transmitter buffer TX and a receiver buffer RX respectively coupled to the I/O terminal 10 for bounding the bound wire shown in FIG. 5, where the notation $T_{TX}$ represents an input terminal of the transmitter buffer TX, and the notation $T_{RX}$ represents an output terminal of the receiver buffer RX. The control terminal TX_En of the transmitter buffer TX is utilized for selectively enabling or disabling the transmitter buffer TX by using a control signal input into the control terminal TX_En, and the control terminal RX_En of the receiver buffer RX is utilized for selectively enabling or disabling the receiver buffer RX by using a control signal input into the control terminal RX_En.

Figure 9:
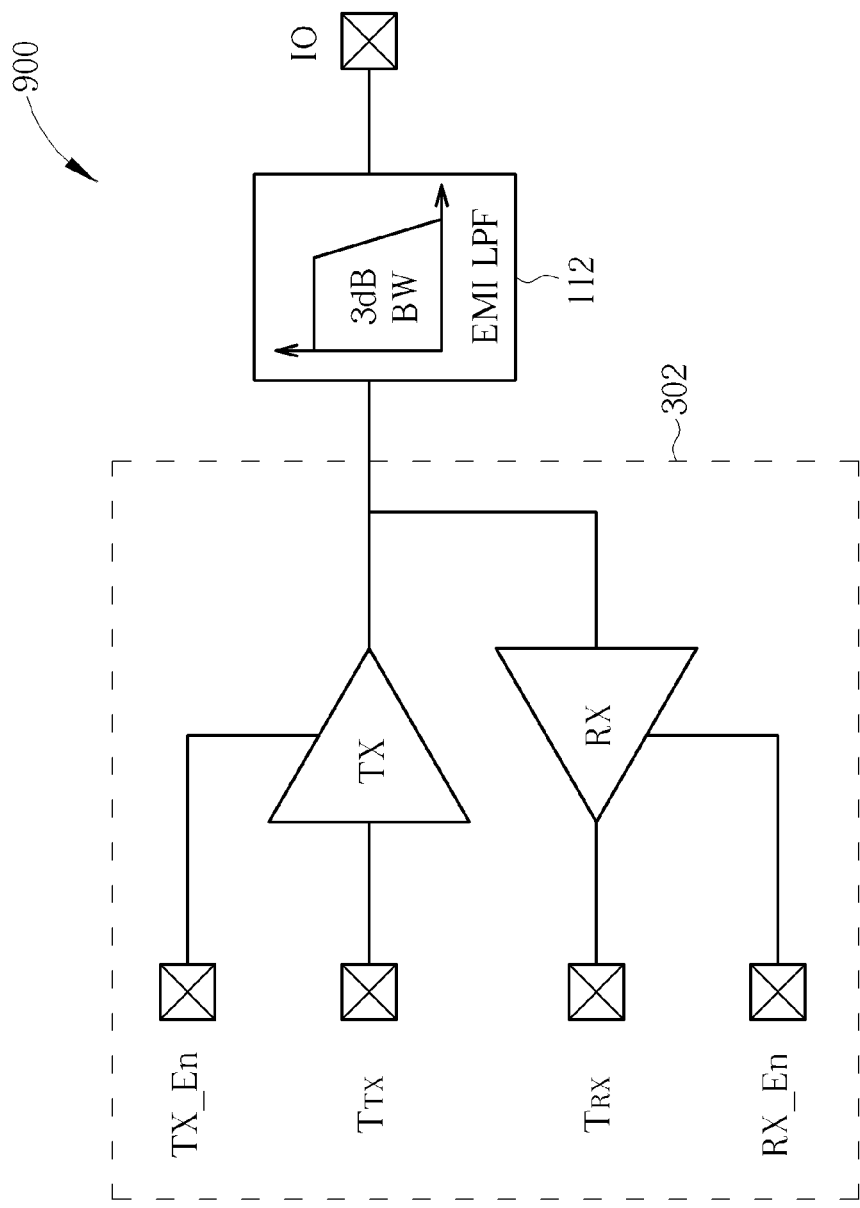
FIG. 9 illustrates some implementation details of the I/O pad unit shown in FIG. 5 with an EMI low pass filter (LPF) being taken as an example of the EMI suppression circuit shown in FIG. 5 according to another embodiment of the present invention.

FIG. 9 illustrates some implementation details of the I/O pad unit 302 shown in FIG. 5 with an EMI low pass filter (LPF) being taken as an example of the EMI suppression circuit 112 shown in FIG. 5 according to another embodiment of the present invention. Based upon the architecture 900 shown in FIG. 9, the I/O pad unit 302 comprises the transmitter buffer TX and the receiver buffer RX shown in FIG. 8, and more particularly, can be the same as the I/O pad unit 302 shown in FIG. 8. In addition, the 3-dB-bandwidth (labeled "3 dB BW" in FIG. 9) of the EMI LPF may be defined by a specific configuration of the EMI LPF.

Figure 10:
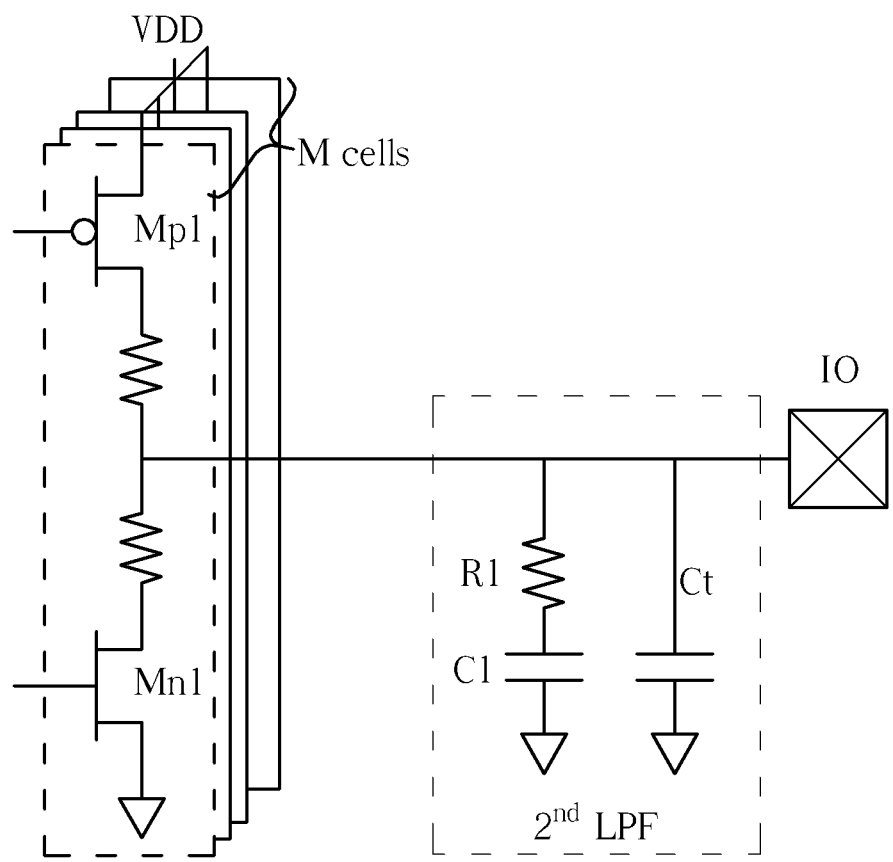
FIG. 10 illustrates some implementation details of the I/O pad modules shown in FIG. 3 according to an embodiment of the present invention.

FIG. 10 illustrates some implementation details of the I/O pad modules 312-1, 312-2, ..., and 312-N shown in FIG. 3 according to an embodiment of the present invention. In practice, the I/O pad modules 312-n may comprise M cells, each of which comprises a p-type Metal Oxide Semiconductor Field Effect Transistor (MOSFET) Mp1 having a terminal being biased by a predetermined voltage level VDD and an n-type MOSFET Mn1 having a terminal being grounded and further comprises two resistors, where the I/O terminal 10 for bounding the bound wire shown in FIG. 5 is electrically connected to an intermediate node between the two resistors. The $2^{nd}$ order LPF shown in FIG. 10 (labeled "$2^{nd}$ LPF", for brevity) is taken as an example of the EMI suppression circuit 112-n associated to the I/O pad modules 312-n.

Figure 11:
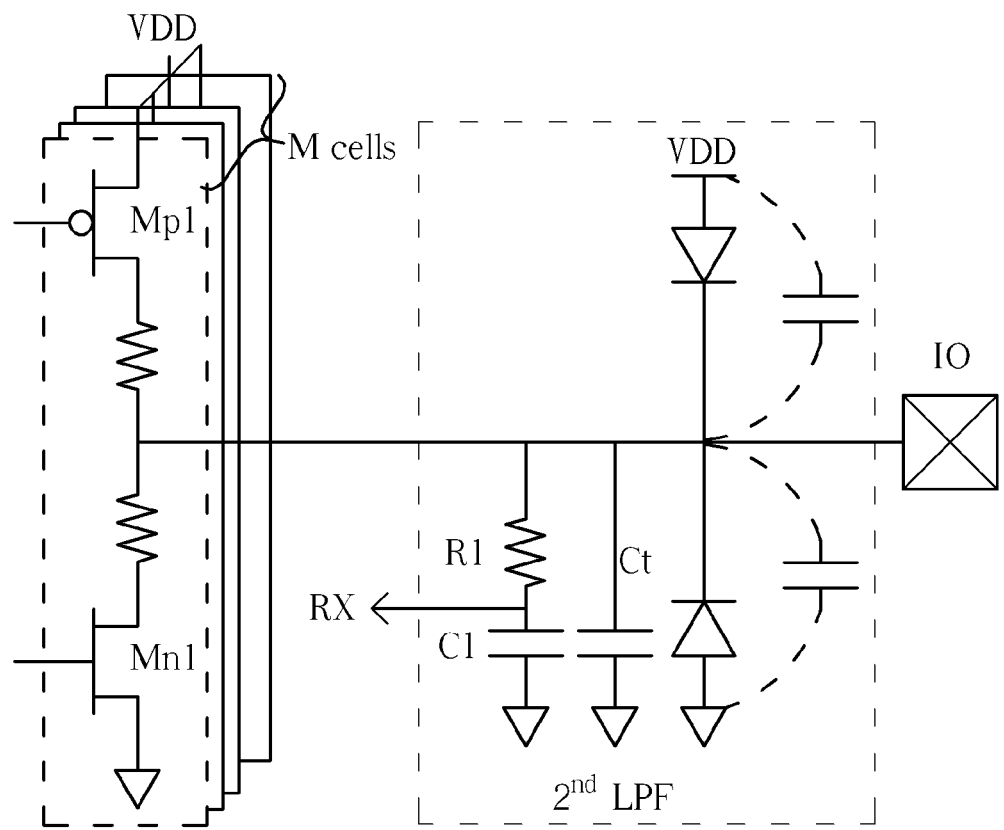
FIG. 11 illustrates some implementation details of the I/O pad modules shown in FIG. 3 according to another embodiment of the present invention.

FIG. 11 illustrates some implementation details of the I/O pad modules 312-1, 312-2, ..., and 312-N shown in FIG. 3 according to another embodiment of the present invention. In comparison with the embodiment shown in FIG. 10, the aforementioned $2^{nd}$ order LPF further comprises two diodes, each of which may have its equivalent capacitance, where the equivalent capacitance is illustrated in FIG. 11 for better comprehension. Similar descriptions for this embodiment are not repeated in detail here.

Figure 12:
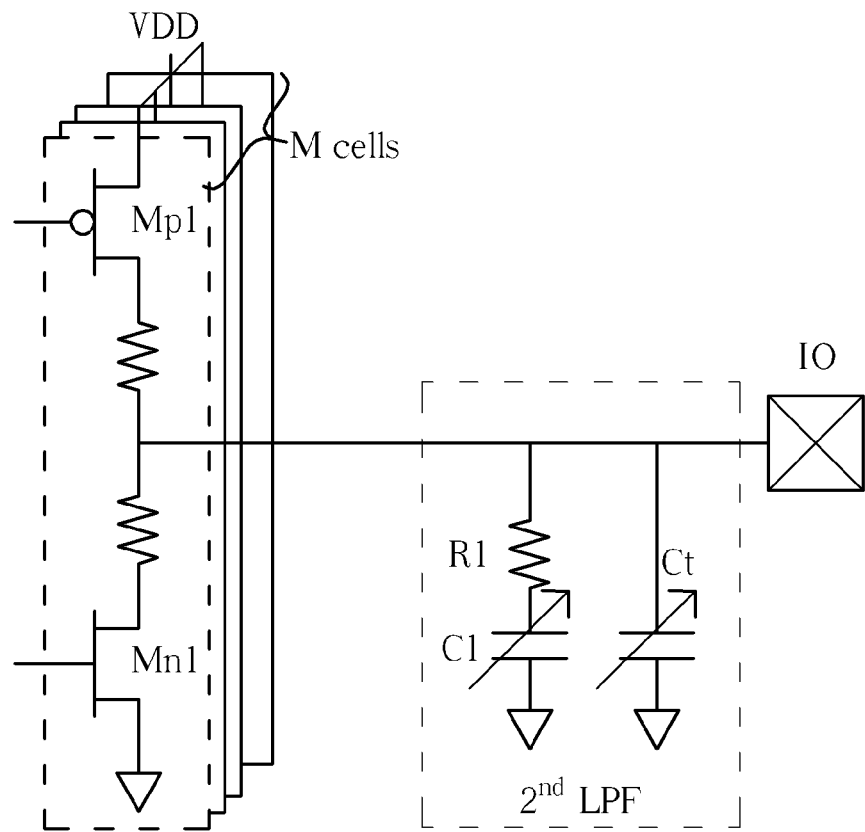
FIG. 12 illustrates some implementation details of the I/O pad modules shown in FIG. 3 according to another embodiment of the present invention.

FIG. 12 illustrates some implementation details of the I/O pad modules 312-1, 312-2, ..., and 312-N shown in FIG. 3 according to another embodiment of the present invention. In comparison with the embodiment shown in FIG. 10, the capacitors C1 and Ct within the aforementioned $2^{nd}$ order LPF are tunable in this embodiment. Similar descriptions for this embodiment are not repeated in detail here.

Figure 13:
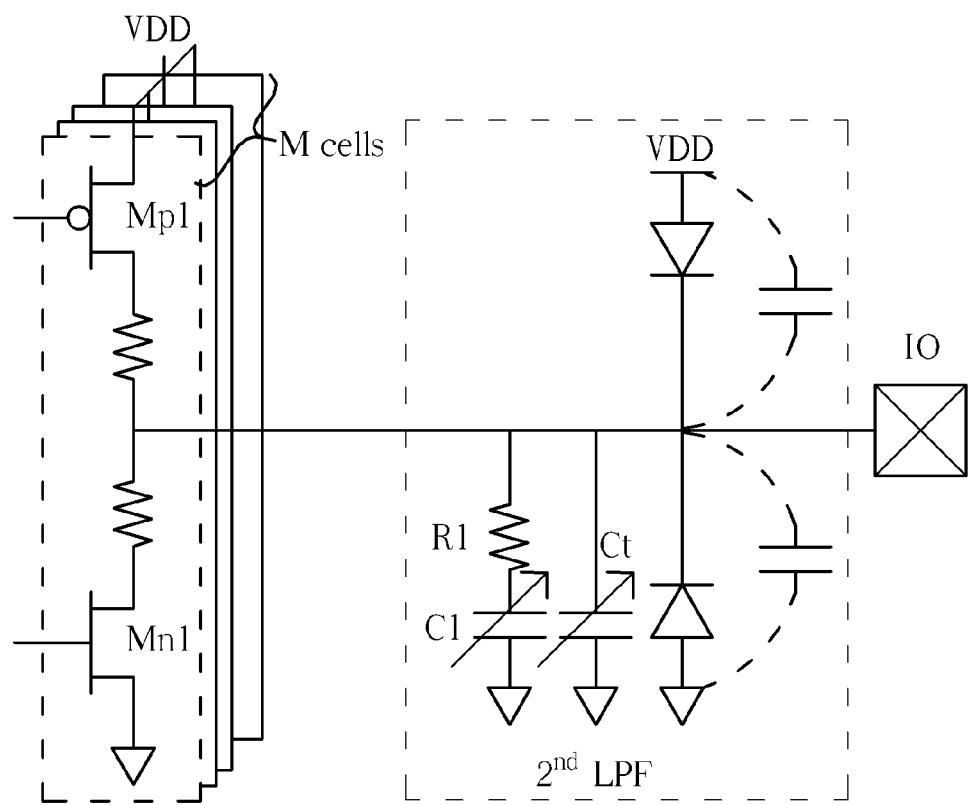
FIG. 13 illustrates some implementation details of the I/O pad modules shown in FIG. 3 according to another embodiment of the present invention.

FIG. 13 illustrates some implementation details of the I/O pad modules 312-1, 312-2, ..., and 312-N shown in FIG. 3 according to another embodiment of the present invention. In comparison with the embodiment shown in FIG. 11, the capacitors C1 and Ct within the aforementioned $2^{nd}$ order LPF are tunable in this embodiment. Similar descriptions for this embodiment are not repeated in detail here.

Figure 14:
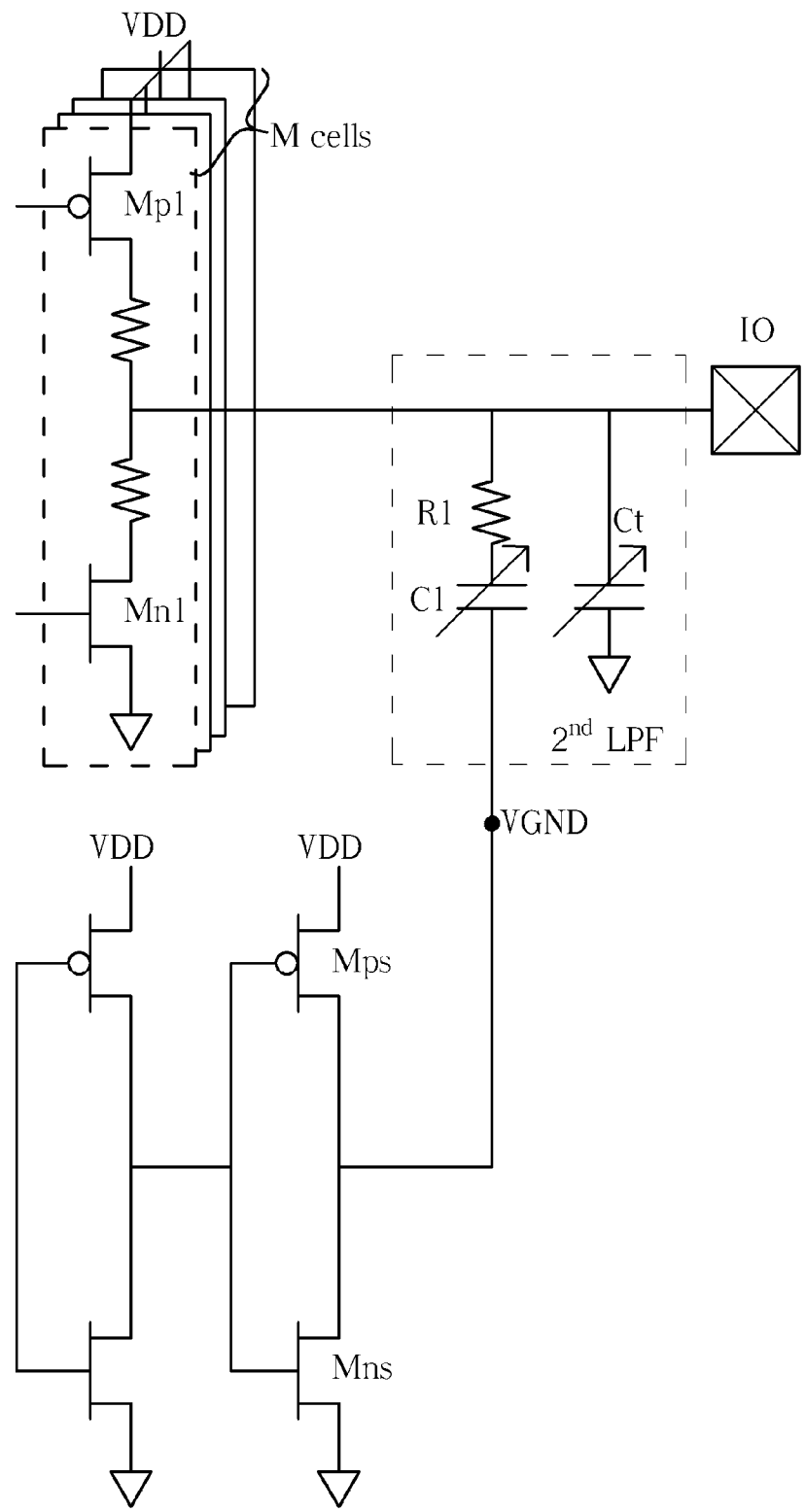
FIG. 14 illustrates some implementation details of the I/O pad modules shown in FIG. 3 according to another embodiment of the present invention.

FIG. 14 illustrates some implementation details of the I/O pad modules 312-1, 312-2, ..., and 312-N shown in FIG. 3 according to another embodiment of the present invention. In comparison with the embodiment shown in FIG. 12, the originally grounded terminal of the capacitor C1 within the aforementioned $2^{nd}$ order LPF is redirected to a virtual ground node VGND. As shown in FIG. 14, the I/O pad modules 312-n may comprise a set of p-type MOSFETs {Mps}, each of which has a terminal being biased by the predetermined voltage level VDD, and may further comprise a set of n-type MOSFETs {Mns}, each of which has a terminal being grounded, where the device width WMps (or the channel width) of each p-type MOSFET Mps and the device width WMns (or the channel width) of each n-type MOSFET Mns can be expressed as follows:

$$WMps = WMp1/N;$$

and $$WMns = WMn1/N;$$

where the notations WMp1 and WMn1 represent the device widths (or the channel widths) of the p-type MOSFET Mp1 and the n-type MOSFET Mn1, respectively. Similar descriptions for this embodiment are not repeated in detail here.

Figure 15:
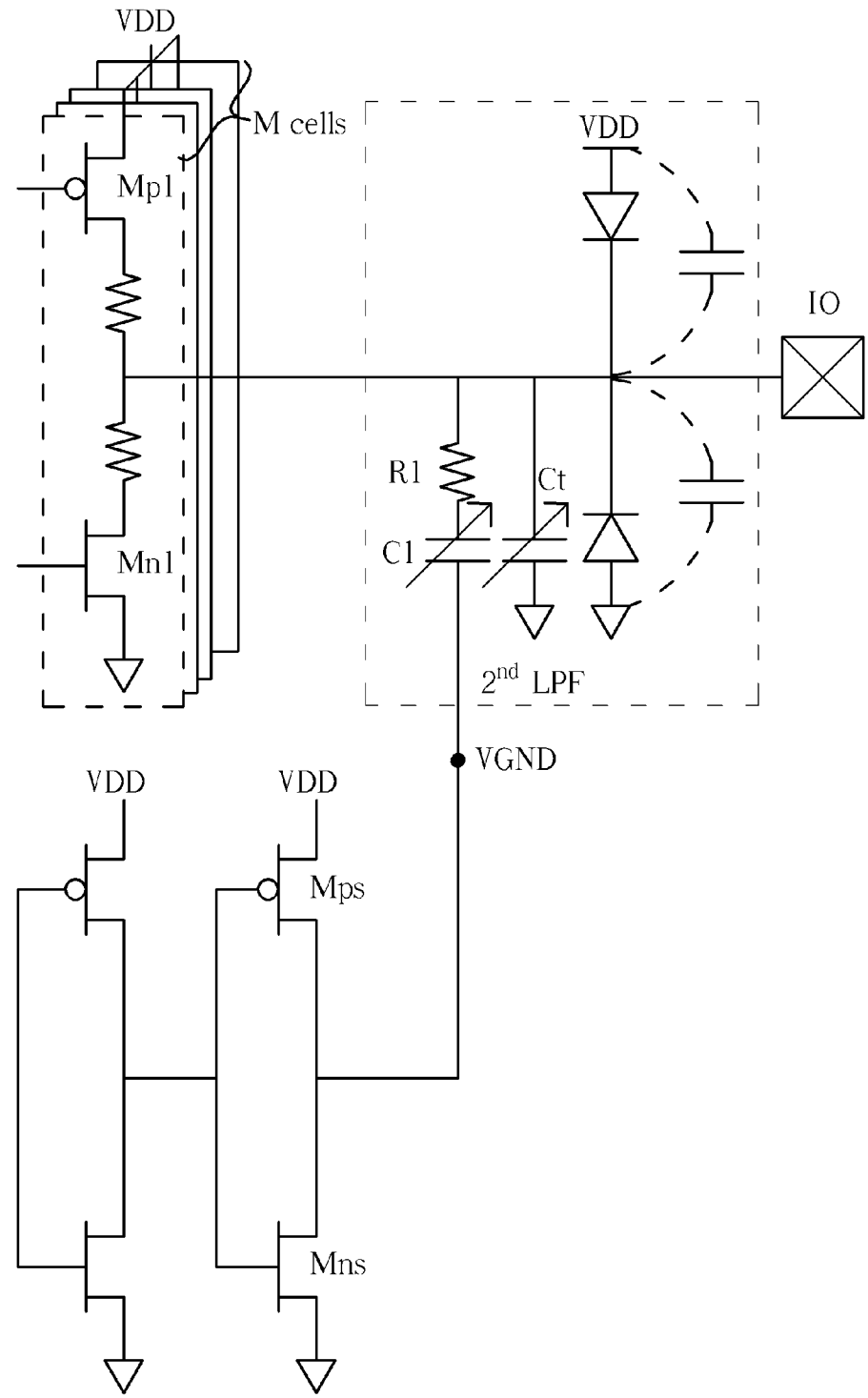
FIG. 15 illustrates some implementation details of the I/O pad modules shown in FIG. 3 according to another embodiment of the present invention.

FIG. 15 illustrates some implementation details of the I/O pad modules 312-1, 312-2, ..., and 312-N shown in FIG. 3 according to another embodiment of the present invention. In comparison with the embodiment shown in FIG. 13, the originally grounded terminal of the capacitor C1 within the aforementioned $2^{nd}$ order LPF is redirected to a virtual ground node such as the virtual ground node VGND disclosed in the embodiment shown in FIG. 14. In addition, the set of p-type MOSFETs {Mps} and the set of n-type MOSFETs {Mns} of this embodiment can be the same as that of the embodiment shown in FIG. 14, respectively. Similar descriptions for this embodiment are not repeated in detail here.

It is an advantage of the present invention that, while utilizing the present invention method and apparatus, the high frequency components corresponding to the sharp edges of the digital signals (more particularly, the clock harmonics) are suppressed in the I/O pad module(s), where the antenna radiation effect mentioned above can be reduced. As a result of performing chip level EMI reduction by utilizing the aforementioned at least one EMI suppression circuit, it is unnecessary to implement with the aforementioned EMI solutions of the related art, and therefore, the related art problems can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing chip level electromagnetic interference (EMI) reduction, the method being applied to an electronic device, the method comprising:
    providing at least one EMI suppression circuit, positioned within at least one chip of the electronic device; and utilizing the at least one EMI suppression circuit to perform EMI reduction on at least one signal within the at least one chip, wherein the at least one EMI suppression circuit is integrated into the at least one chip.

2. The method of claim 1, wherein the at least one chip comprises a first chip and a second chip; and the at least one EMI suppression circuit comprises a first EMI suppression circuit positioned within the first chip, and further comprises a second EMI suppression circuit positioned within the second chip.

3. The method of claim 2, wherein the at least one signal comprises a first signal within the first chip, and further comprises a second signal within the second chip; and utilizing the at least one EMI suppression circuit within the at least one chip to perform the EMI reduction on the at least one signal within the at least one chip further comprises:
  utilizing the first EMI suppression circuit positioned within the first chip to perform EMI reduction on the first signal within the first chip; and
  utilizing the second EMI suppression circuit positioned within the second chip to perform EMI reduction on the second signal within the second chip.

4. The method of claim 1, wherein the at least one chip comprises a first chip; and the at least one EMI suppression circuit comprises a first EMI suppression circuit positioned within the first chip, and further comprises a second EMI suppression circuit positioned within the first chip.

5. The method of claim 4, wherein the at least one signal comprises a first signal within the first chip, and further comprises a second signal within the first chip; and utilizing the at least one EMI suppression circuit within the at least one chip to perform the EMI reduction on the at least one signal within the at least one chip further comprises:
  utilizing the first EMI suppression circuit positioned within the first chip to perform EMI reduction on the first signal within the first chip; and
  utilizing the second EMI suppression circuit positioned within the first chip to perform EMI reduction on the second signal within the first chip.

6. The method of claim 1, wherein the at least one chip comprises a first chip; and the at least one EMI suppression circuit comprises a first EMI suppression circuit positioned within the first chip.

7. The method of claim 6, wherein the at least one signal comprises a first signal within the first chip; and utilizing the at least one EMI suppression circuit within the at least one chip to perform the EMI reduction on the at least one signal within the at least one chip further comprises:
  utilizing the first EMI suppression circuit positioned within the first chip to perform EMI reduction on the first signal within the first chip.

8. The method of claim 6, wherein the first EMI suppression circuit is electrically connected to an internal signal path of the first chip; and the internal signal path is coupled to an input/output (I/O) pad of the first chip.

9. The method of claim 6, wherein at least one non-ground terminal of the first EMI suppression circuit is electrically connected to an internal signal path of the first chip; and at least one ground terminal of the first EMI suppression circuit is electrically connected to ground or virtual-ground of the first chip.

10. The method of claim 1, wherein utilizing the at least one EMI suppression circuit within the at least one chip to perform the EMI reduction on the at least one signal within the at least one chip further comprises:
  utilizing the at least one EMI suppression circuit within the at least one chip to perform the EMI reduction on the at least one signal within the at least one chip, whereby radiation of at least one signal path outside the at least one chip is reduced.

11. An apparatus for performing chip level electromagnetic interference (EMI) reduction, the apparatus comprising at least one portion of an electronic device, the apparatus comprising:
  at least one chip of the electronic device; and
  at least one EMI suppression circuit integrated into the at least one chip of the electronic device, wherein the at least one EMI suppression circuit positioned within the at least one chip is arranged to perform EMI reduction on at least one signal within the at least one chip.

12. The apparatus of claim 11, wherein the at least one chip comprises a first chip and a second chip; and the at least one EMI suppression circuit comprises a first EMI suppression circuit positioned within the first chip, and further comprises a second EMI suppression circuit positioned within the second chip.

13. The apparatus of claim 12, wherein the at least one signal comprises a first signal within the first chip, and further comprises a second signal within the second chip; the first EMI suppression circuit positioned within the first chip performs EMI reduction on the first signal within the first chip; and the second EMI suppression circuit positioned within the second chip performs EMI reduction on the second signal within the second chip.

14. The apparatus of claim 11, wherein the at least one chip comprises a first chip; and the at least one EMI suppression circuit comprises a first EMI suppression circuit positioned within the first chip, and further comprises a second EMI suppression circuit positioned within the first chip.

15. The apparatus of claim 14, wherein the at least one signal comprises a first signal within the first chip, and further comprises a second signal within the first chip; the first EMI suppression circuit positioned within the first chip performs EMI reduction on the first signal within the first chip; and the second EMI suppression circuit positioned within the first chip performs EMI reduction on the second signal within the first chip.

16. The apparatus of claim 11, wherein the at least one chip comprises a first chip; and the at least one EMI suppression circuit comprises a first EMI suppression circuit positioned within the first chip.

17. The apparatus of claim 16, wherein the at least one signal comprises a first signal within the first chip; and the first EMI suppression circuit positioned within the first chip performs EMI reduction on the first signal within the first chip.

18. The apparatus of claim 16, wherein the first EMI suppression circuit is electrically connected to an internal signal path of the first chip; and the internal signal path is coupled to an input/output (I/O) pad of the first chip.

19. The apparatus of claim 16, wherein at least one non-ground terminal of the first EMI suppression circuit is electrically connected to an internal signal path of the first chip; and at least one ground terminal of the first EMI suppression circuit is electrically connected to ground or virtual-ground of the first chip.

20. The apparatus of claim 11, wherein the at least one EMI suppression circuit within the at least one chip performs the EMI reduction on the at least one signal within the at least one chip, whereby radiation of at least one signal path outside the at least one chip is reduced.

* * * * *